(12) United States Patent
Schmitteckert

(10) Patent No.: US 7,143,636 B2
(45) Date of Patent: Dec. 5, 2006

(54) FIELD DEVICE FOR DETERMINING AND/OR MONITORING A PROCESS VARIABLE

(75) Inventor: Monika Schmitteckert, Kirchzarten (DE)

(73) Assignee: Endress + Hauser GmbH + Co. KG, Maulburg (DE)

(*) Notice: Subject to any disclaimer, the term of this patent is extended or adjusted under 35 U.S.C. 154(b) by 0 days.

(21) Appl. No.: 10/982,931

(22) Filed: Nov. 8, 2004

(65) Prior Publication Data
US 2005/0160797 A1 Jul. 28, 2005

(30) Foreign Application Priority Data
Nov. 7, 2003 (DE) .................. 103 52 471

(51) Int. Cl.
*G01M 3/00* (2006.01)
(52) U.S. Cl. ......................................... 73/52
(58) Field of Classification Search ................. 73/49.8, 73/48, 49.3, 40.7
See application file for complete search history.

(56) References Cited

U.S. PATENT DOCUMENTS 5,796,097 A  8/1998  Lawrence
6,063,632 A  5/2000  Perkins
2003/0030517 A1*  2/2003  Munley et al. ............. 333/252
2004/0232620 A1*  11/2004  Bock et al. ................. 277/320

FOREIGN PATENT DOCUMENTS

DE  2 228 761  1/1973
DE  101 44 230  3/2003
GB  2 330 659  4/1999

* cited by examiner

Primary Examiner—Hezron Williams
Assistant Examiner—Paul M. West
(74) Attorney, Agent, or Firm—Bacon & Thomas

(57) ABSTRACT

The invention relates to a field device (1) for determining and/or monitoring a physical and/or chemical process variable of a medium (5) in a container (6), including a first sealing stage (10) facing the process, at least one housing (15) having a predetermined internal volume (16), which is provided on the side of the first sealing stage (10) facing away from the process, wherein in the housing (15) at least one opening (20) is provided, which connects the internal volume (16) of the housing (15) with a space outside of the container (6). The invention includes that in the internal volume (16) an intermediate medium (21) is present, which is of a character such that it indicates via the opening (20) the case in which the first sealing stage (10) no longer seals.

4 Claims, 1 Drawing Sheet

FIELD DEVICE FOR DETERMINING AND/OR MONITORING A PROCESS VARIABLE

FIELD OF THE INVENTION

The invention relates to a field device for determining and/or monitoring a physical and/or chemical process variable of a medium in a container, having a first sealing stage facing the process, at least one housing with a predetermined internal volume located on the side of the first sealing stage facing away from the process, wherein, in the housing, at least one opening is provided, which connects the internal volume of the housing with a space outside of the container. The process variable can be fill level, density, viscosity, temperature, or e.g. the pH-value of the medium. Other process variables are, however, also possible.

BACKGROUND OF THE INVENTION

For detecting the limit level of liquids or bulk goods in containers, capacitive measuring devices, vibratory systems or mechanical systems are applied. Besides these limit level detectors, which signal the reaching of a predetermined fill level, as soon as they come in contact with the medium, there are also contactlessly working field devices, using ultrasonic waves, microwaves or radioactive radiation. Fill level can then be determined e.g. on the basis of the travel time method. With the exception of the vibratory systems and the mechanical systems, the above-mentioned measuring or field devices are also suitable for the continuous measurement of fill level.

The field devices, independently of principle of measurement and process variable, are usually sealed in the direction of the process, against the process. Depending on application, it is necessary also to isolate the field device safely and reliably in the direction of a remote control location, relative to the remote control location. This sealing is especially important, when an aggressive or explosive atmosphere is located in the container. If e.g. an explosive gas mixture gets into the housing of the field device, then there is an acute danger of explosion, due to the direct contact with the electrical, or electronic, components of the field device. Moreover, a field device is usually connected via connection lines with a remote control location. If the field device is not sealed also in that direction, then it can not be excluded that the explosive, aggressive or poisonous gas mixture reaches the remote control location via the lines and causes damage there. A method for checking whether the seal facing the process is tight is to provide between the two seals an opening, e.g. a hole in the housing, through which the medium or gas mixture located in the container escapes from the housing, upon the occurrence of a leakage, and thus gives an obvious signal. This is, however, questionable in the case of dangerous and/or environmentally damaging substances. Furthermore, this is also scarcely acceptable in the case of hygienic applications—e.g. foods and pharmaceuticals.

An object of the invention is to provide a field device for use in dangerous and critical areas.

The object is achieved according to the invention by providing in the internal volume at least one intermediate medium, which is of a character such that it indicates via the opening the case where the first sealing stage no longer seals. The idea is, thus, that compromise of the first sealing stage is indicated not by the medium or by a gas present in the container and in communication with the medium, but, instead, by a special intermediate medium. The opening in the housing is, according to the state of the art, intended therefor, that the medium or a gas itself escapes out of the opening and, consequently indicates e.g. the leakage in the first seal. This indicating function is assumed, according to the invention, by the intermediate medium. This has the advantage that the medium does not escape first and, in so doing, possibly contaminate the environment or threaten the health of the operating personnel. The intermediate medium thus acts as a buffer. Additionally, an intermediate medium can prevent a contamination, when the intermediate medium acts, for example, to enclose the leaking medium.

One embodiment of the invention provides that the intermediate medium is coordinated with the medium. It must be prevented, for example, that mixing of medium, or gas mixture, and intermediate medium leads possibly to a still more harmful compound. It also has to be assured that the intermediate medium reacts upon the incursion of the medium or a gas associated with the medium and can indicate such.

Another embodiment provides that the intermediate medium is of a character such that it at least visually and/or acoustically and/or haptically and/or olfactorially shows that the first sealing stage is compromised. Thus, a maximum of sensory indication possibilities is used, either separately or in combination with one another. For instance, an odor can be produced, or a colored vapor, or a noise. An indication of taste would be more difficult to implement.

SUMMARY OF THE INVENTION

An advantageous embodiment includes that the intermediate medium is of a character such that it at least partially seals the opening, when the first sealing stage no longer seals. The opening is, thus, at least partially sealed by the intermediate medium. The permanence of this sealing effect depends, however, on the type and character of the medium, respectively the gas mixture present in the container, and on the prevailing conditions—e.g. the pressure on the medium. At least in this way, an indication occurs, and, for a first instant, at least, it is prevented that the medium reaches the environment. The intermediate medium thus wins time for reacting.

An advantageous embodiment provides that the intermediate medium is of a character such that it increases in volume in the case where the first sealing stage has become unsealed. The medium leaking through the compromised location of the first sealing stage—or the gas mixture leaking through, as the case may be—thus effects that the intermediate medium expands and, in the process, is preferably pressed out of the opening. This is e.g. possible with polyethylene. By this swelling, a sealing function is simultaneously assumed. Ideally, the intermediate medium encloses the escaping gases or liquids, thus the medium or other substance present in the container.

BRIEF DESCRIPTION OF THE DRAWING

The invention will now be explained in greater detail on the basis of the accompanying drawing, the figure of which shows as follows.

DESCRIPTION OF THE PREFERRED EMBODIMENTS

Figure 1:
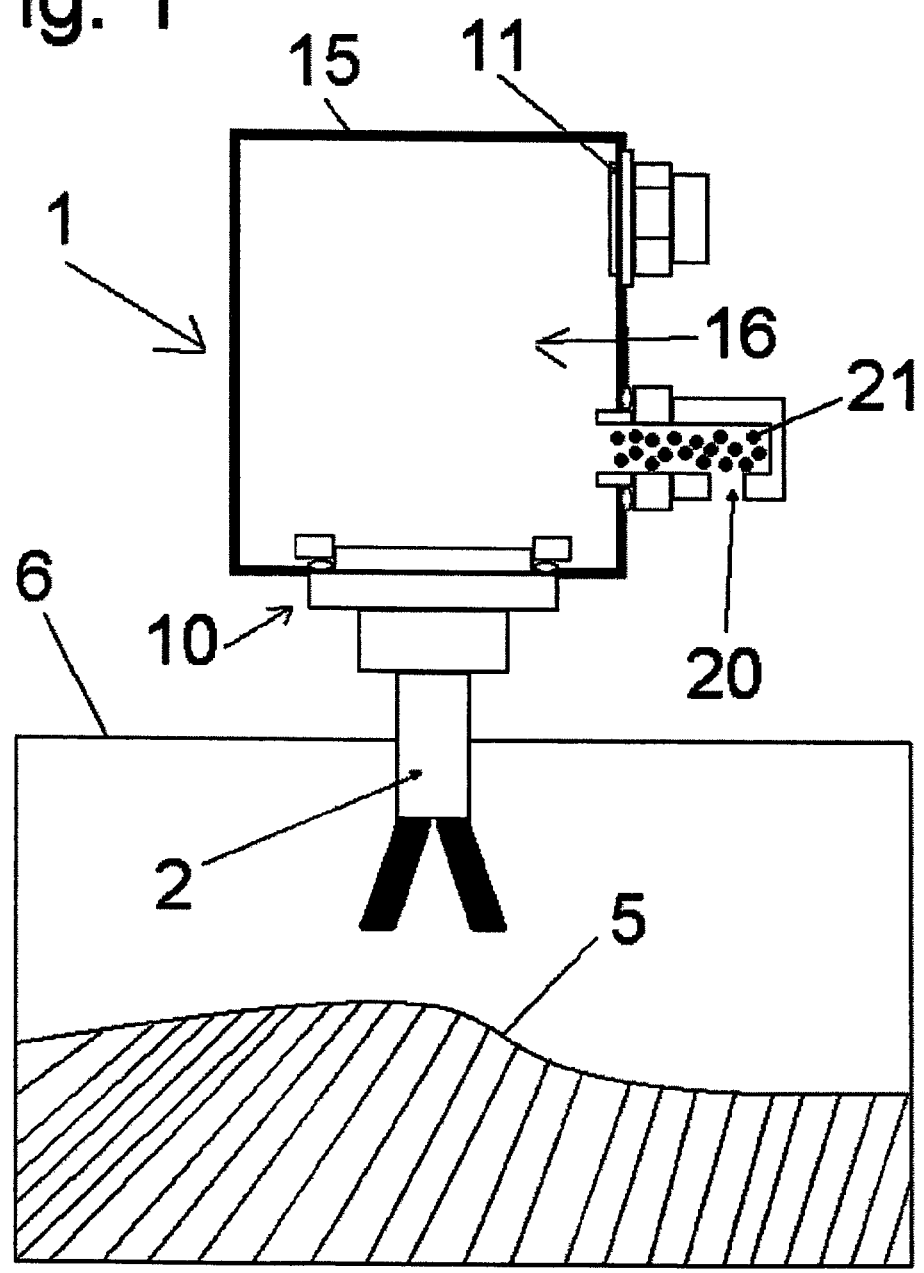
FIG. 1 a schematic illustration of the field device of the invention.

FIG. 1 shows a field device 1 of the invention. The sensor 2 involves a tuning fork, available from the assignee under the mark LIQUIPHANT. Such a tuning fork is excited to mechanical oscillations. If the sensor 2 comes in contact with the medium 5, then the frequency and/or the amplitude of the oscillations changes. This permits a conclusion to be made as to the fill level of the medium in the container 6. Also a gas mixture (not shown) can be present in the container 6. Practice of the invention is, however, not limited to tuning forks; instead, any other principle of measurement can be used. The sensor 2 is connected via a first sealing stage 10 with the housing 15, in whose internal volume 16 are located, for example, control/evaluation circuits or display units (neither of which is shown). The housing 15 has a second sealing stage 11, via which the field device 1 is connected, for example, over a line with a control unit or a supervisory installation (neither of which is shown). The opening 20 is provided for the purpose of allowing the medium 5 or a gas mixture to escape in the case of a leakage of the first sealing stage and, in this way, to provide a clear sign that the first sealing stage 10 is defective. According to the invention, an intermediate medium 21 is provided. This can fill the entire internal volume 16, or, as shown here, be present only in the immediate vicinity of the opening 20. In this example, the intermediate medium 21 involves a substance, whose volume becomes greater, when it comes into contact with the medium 5 or the gas mixture. This volume enlargement leads to an issuing of the intermediate medium 21 out of the opening 20. Additionally, the intermediate medium 21 assumes a sealing function. If the intermediate medium 21 is visible outside of the opening, then this is a sign that the first sealing stage 10 no longer seals. Other embodiments include that the intermediate medium 21 reacts with the medium 5 or the gas mixture in such a way that an odor or, generally, an aromatic compound is produced. The intermediate medium can also involve a distensible membrane, which is pushed outwards by the medium 5 or the associated gas mixture penetrating into the internal volume 16 (comparable, thus, to an air balloon, which is being blown up.

The invention claimed is:

1. A sealed field device for determining and/or monitoring a physical and/or chemical process variable of a medium in a container, the sealed field device including:
   at least one housing enclosing a predetermined internal volume; and
   a first sealing stage connected to said at least one housing and facing away from the medium within the container, wherein:
   said predetermined internal volume is provided on the side of said first sealing stage facing away from the medium within the container;
   said at least one housing including at least one opening, which connects the internal volume of said at least one housing with a space outside of the container,
   said internal volume containing at least one intermediate medium, whose character is such that it indicates via said at least one opening the case in which said first sealing stage no longer seals, and
   said intermediate medium is of a character such that it indicates at least visually and/or acoustically and/or haptically and/or olfactorially the case in which said first sealing stage no longer seals.

2. The sealed field device as claimed in claim 1, wherein:
   said intermediate medium is coordinated with the medium.

3. A sealed field device for determining and/or monitoring a physical and/or chemical process variable of a medium in a container, the sealed field device including:
   at least one housing enclosing a predetermined internal volume; and
   a first sealing stage connected to said at least one housing and facing away from the medium within the container, wherein:
   said predetermined internal volume is provided on the side of said first sealing stage facing away from the medium within the container,
   said at least one housing including at least one opening, which connects the internal volume of said at least one housing with a space outside of the container,
   said internal volume containing at least one intermediate medium, whose character is such that it indicates via said at least one opening the case in which said first sealing stage no longer seals, and
   said intermediate medium is of a character such that it increases its volume in the case in which said first sealing stage no longer seals.

4. The sealed field device as claimed in claim 3, wherein:
   said intermediate medium is of a character such that it increases its volume in the case in which said first sealing stage no longer seals.

* * * * *